(12) United States Patent
Komatsu et al.

(10) Patent No.: US 6,660,409 B1
(45) Date of Patent: Dec. 9, 2003

(54) ELECTRONIC DEVICE AND PROCESS FOR PRODUCING THE SAME

(75) Inventors: Takahiro Komatsu, Kasuga (JP); Akira Gyoutoku, Saga-ken (JP); Shintaro Hara, Fukuoka (JP); Takafumi Hamano, Fukuoka (JP); Hiroshi Nakashima, 17-12, Toyoham-1-chome, Nishi-ku, Fukuoka-shi (JP); Dawei Gao, Yokohama (JP); Katsunori Muraoka, Fukuoka-ken (JP); Katsuhiko Furukawa, Fukuoka (JP)

(73) Assignees: Panasonic Communications Co., Ltd, Fukuoka (JP); Hiroshi Nakashima, Fukuoka (JP)

( * ) Notice: Subject to any disclaimer, the term of this patent is extended or adjusted under 35 U.S.C. 154(b) by 0 days.

(21) Appl. No.: 09/660,335

(22) Filed: Sep. 12, 2000

(30) Foreign Application Priority Data

Sep. 16, 1999 (JP) ............................................. 11-262052
Jul. 10, 2000 (JP) ........................................ 2000-208014

(51) Int. Cl.⁷ .............................................. H05B 33/04
(52) U.S. Cl. ....................... 428/690; 428/917; 313/506; 313/512; 257/99; 257/100
(58) Field of Search ................................. 428/690, 917; 313/506, 512; 257/99, 100; 252/301.35

(56) References Cited

U.S. PATENT DOCUMENTS

| | | | |
|---|---|---|---|
| 4,885,211 A | | 12/1989 | Tang et al. |
| 5,156,909 A | * | 10/1992 | Henager, Jr. et al. ........ 428/334 |
| 5,188,876 A | * | 2/1993 | Hensel et al. |
| 5,882,761 A | | 3/1999 | Kawami et al. |
| 6,146,225 A | * | 11/2000 | Sheats et al. .................. 445/24 |
| 6,195,142 B1 | * | 2/2001 | Gyotoku et al. .............. 349/69 |
| 6,198,220 B1 | * | 3/2001 | Jones et al. .................. 313/512 |
| 6,268,695 B1 | * | 7/2001 | Affinito ...................... 313/504 |

FOREIGN PATENT DOCUMENTS

| | | | | |
|---|---|---|---|---|
| JP | | 589959 | 4/1993 | |
| JP | | 5121172 | 5/1993 | |
| JP | | 696858 | 4/1994 | |
| JP | | 6176867 | 6/1994 | |
| JP | | 7211455 | 8/1995 | |
| JP | | 9148066 | 5/1997 | |
| JP | | 10261487 | 9/1998 | |
| JP | 11144864 A | * | 5/1999 | ............ H05B/33/04 |

OTHER PUBLICATIONS

Extended Abstracts (the 46th Meeting, 1999); The Japan Society of Applied Physics and Related Societies No. 2; p. 880, with English Abstract.

* cited by examiner

*Primary Examiner*—Cynthia H. Kelly
*Assistant Examiner*—Dawn L. Garrett
(74) *Attorney, Agent, or Firm*—Stevens, Davis, Miller & Mosher, LLP

(57) ABSTRACT

Electrically functional electronic device including an organic electroluminescence device is protected with a dense protective film, e.g. a silicon oxynitride film, formed on at least one part of the outer surface of the device at a low temperature by ECR plasma sputtering can prevent permeation of moisture, oxygen etc. into the device from the outside.

2 Claims, 4 Drawing Sheets

Flow Rate Ratio $O_2/(N_2+O_2)$

FIG. 7

ELECTRONIC DEVICE AND PROCESS FOR PRODUCING THE SAME

BACKGROUND OF THE INVENTION

1) Field of the Invention

The present invention relates to a protective film for use in sealing or protection of various electronic devices such as organic electroluminescence devices, etc. used in light emitting devices, etc. in various display devices or light sources or backlight in display devices or optical communication systems, and a process for producing the same.

2) Related Art of the Invention

Generally, electronic devices are protected by sealing to some extent, because they are highly susceptible to external circumstance factors such as moisture, heat, etc., and recent trends toward higher density and higher precision of electronic devices are requiring highly reliable sealing, and thus intensive studies have been so far fostered.

Materials so far used for this purpose are shifting from the inorganic system to the organic/inorganic complex systems taking the versatility of organic materials into consideration. It is now an important problem how to suppress degradation of organic materials very easily susceptible to external circumstance factors such as moisture, heat, stress, etc.

It is organic electroluminescence devices that have recently attracted attention among devices using such organic materials.

Electroluminescence device is a light-emitting device based on electroluminescence of solid fluorescent substances, and inorganic electroluminescence devices based on inorganic light-emitting materials have been so far practically applied to the backlight of liquid crystal display, flat display, etc.

Electroluminescence devices based on organic materials, on the other hand, have been long studied in various ways, but very poor light-emitting efficiency has been a bottleneck to full scale practical application study.

However, C. W. Tang et al of Eastman Kodak Co. proposed in 1987 an organic electroluminescence device in a functionally separated type, stacked layer structure, where organic materials were divided into two layers, i.e. a hole transport layer and a light-emitting layer, and disclosed that a high luminance e.g. 1,000 cd/m² or more could be obtained even at a low voltage such as 10 V or less [C. W. Tang and S. A. Vanslyke: Appl. Phys. Lett., 51 (1987), 913, etc.]. After the disclosure the organic electroluminescence devices were suddenly highlighted and extensive studies have been made of organic electroluminescence devices in a similar functionally separated type, stacked layer structure, some of which are now practically used.

Explanation will be made below of the conventional organic electroluminescence device, referring to FIG. 7.

Figure 7:
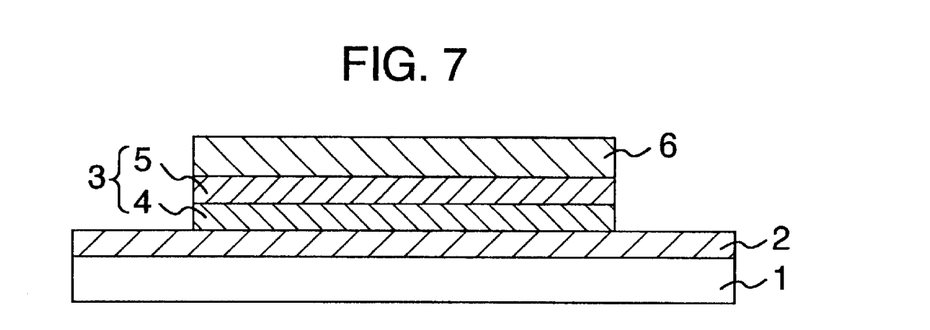
FIG. 7 is a cross-sectional view showing the essential part of the conventional organic electroluminescence device.

FIG. 7 is a cross-sectional view showing the essential part of the conventional organic electroluminescence device, where reference numerals have the following meanings: 1: substrate, 2: anode, 3: organic thin film layer, 4: hole transport layer, 5: light-emitting layer and 6: cathode.

As shown in FIG. 7, the conventional organic electroluminescence device comprises transparent or opaque substrate 1 of glass, etc., anode 2 made from a transparent conductive film of ITO, etc. formed on substrate 1 by sputtering, resistance-heated vapor deposition, etc., hole transport layer 4 made from N,N'-diphenyl-N,N'-bis(3-methylphenyl)-1,1'-diphenyl-4,4,-diamine (hereinafter referred to as TPD), etc., formed on anode 2 by resistance-heated vapor deposition, etc., light-emitting layer 5 made from 8-hydroquinoline aluminum (hereinafter referred to as $Alq_3$), etc. formed on hole transport layer 4 by resistance-heated vapor deposition, etc., and cathode 6 made from a metal film, etc. formed on light-emitting layer 5 by resistance-heated vapor deposition, etc., where hole transport layer 4 and light-emitting layer 5 constitute organic thin film layer 3 in FIG. 7.

When a DC voltage is applied or direct current is passed between anode 2 as a plus electrode and cathode 6 as a minus electrode in the organic electroluminescence device in the stacked layer structure, holes are injected into light-emitting layer 5 from anode 2 through hole transport layer 4 and electrons are injected into light-emitting layer 5 from cathode 6. In light-emitting layer 5, holes and electrons are recombined to form excitons and when the excitons thus formed are shifted from the excited state to the ground state light emission phenomena take place. Light emission wavelength can be changed by changing the stacked layer structure of organic thin film layer 3 or materials of light-emitting layer 5.

To improve light emission characteristics of such an organic electroluminescence device, studies have been made of 1) improvement of the structure of organic thin film layer, i.e. light-emitting layer, hole transport layer, etc. or organic materials for these layers and 2) improvement of anode and cathode materials.

For example, to lower the barrier between the cathode and the light-emitting layer, thereby facilitating injection of electrons into the light-emitting layer in case of 2), materials of small work function and high electroconductivity, e.g. Mg—Ag alloys (U.S. Pat. No. 4,885,211), Al—Li alloys (JP-A-5-121172), etc. were proposed, and these materials have been widely used even now.

However, these alloy materials undergo corrosion or oxidation through reactions with moisture or oxygen in air because of their high activities and chemical unstableness. Such cathode corrosion or oxidation gives rise to considerable growth of non-emitting regions, so called dark spots (D.S.) in the light-emitting layer, and is a cause for characteristic degradation with time of organic electroluminescence devices.

Generally, structural changes due to reactions with moisture or oxygen takes place not only in cathode, but also in organic materials used for the organic thin film layer including the light-emitting layer, the hole transport layer, etc., and thus is likewise a cause for D.S. growth.

As a result of studies on D.S. growth from various viewpoints, the present inventors have found that even such a very small amount of moisture as found in vacuum of about $10^{-4}$ Torr can promote D.S. growth. To prevent reactions of cathode materials or organic thin film layer materials with moisture or oxygen, thereby completely eliminating D.S. growth and improving durability and reliability of organic electro-luminescence devices, it is necessary to seal the entire organic electroluminescence devices.

For sealing the organic electroluminescence devices, studies have been made so far mainly of the following two procedures. One procedure is to form a protective film on the outer surface of an organic electroluminescence device by vacuum film formation such as vapor deposition, etc., and another procedure is to seal an organic electroluminescence device with a shielding material such as a glass cap, etc.

As to the former procedure for forming a protective film, thereby sealing an organic electroluminescence device, for example, JP-A-6-96858 discloses forming GeO, SiO, AlF$_3$, etc. on the outer surface of the device by ion plating.

Furthermore, JP-A-10-261487 discloses formation of Si$_3$N$_4$, diamond-like carbon film, etc. on the outer surface of the device by ECR plasma CVD.

Still furthermore, JP-A-7-211455 discloses formation of a protective film comprising a water-absorbable material having a water absorption percentage of not less than 1% and a moisture-resistant material having a moisture absorption percentage of not more than 0.1%.

As to the latter procedure for sealing an organic electroluminescence device with a shielding material, the following procedures are available: procedure of providing a glass plate on the outer surface of a back electrode and sealing silicone oil into between the back electrode and the glass plate, as already used in case of inorganic electroluminescence devices; procedure of forming a protective film comprising an insulating inorganic compound, followed by shielding with an electrically insulating glass or electrically insulating hermetic seal fluid (JP-A-5-89959); procedure of sealing a drying agent into a hermetically sealed container (JP-A-6-176867 and JP-A-9-48066), etc.

However, any of these procedures not only fails to meet an increasing demand for a thinner type device, which is characteristic of organic electroluminescence devices, but also fails to meet an expected increasing demand for a film type device. As to sealing procedures which can meet the expected demand for the film type device, procedures of forming a protective film to cover the device have been already proposed. For example, the aforementioned JP-A-10-261487 discloses formation of a diamond-like carbon film or Si$_3$N$_4$, etc. on the outer surface of the device by ECR plasma CVD.

As described above, various procedures have been tried to seal organic electroluminescence devices, and it is desirable from the viewpoint of utilizing an important characteristic of organic electroluminescence devices, i.e. small thickness to conduct sealing only with a thin protective film.

Sputtered SiO$_2$ or Al$_2$O$_3$ has been so far used for a protective film for ordinary electronic devices, but since the organic electroluminescence device is not heat-resistant, film formation procedure accompanying a temperature elevation during the film formation, such as the ordinary sputtering, is not suitable for the organic electroluminescence device.

Vapor deposition, electron beam vapor deposition, ion plating, etc. can be expected as other protective film formation procedures, but the vapor deposition has a problem of porous film formation, and the electron beam vapor deposition and the ion plating have a problem of temperature elevation, and no suitable protective film formation procedure for the organic electroluminescence device has been established yet.

For example, in the protective film formation by ion plating as disclosed in JP-A-6-96858, it is difficult to form a thicker protective film because of temperature elevation during the film formation or internal stress in the film after the film formation, and thus it is impossible to completely suppress D.S. growth.

In the protective film formation by ECR plasma CVD as disclosed in JP-A-10-261487, such a gaseous raw material as SiH$_4$, etc. must be used and the process is so complicated that the cost is inevitably increased. Furthermore, such problems have encountered that in case the gaseous raw material is hardly available, no such a protective film can be formed, either, or the like.

As to the sealing by shielding material tried so far, improvement of shielding materials has been so far made, but no complete suppression of D.S. growth has been attained yet.

As a result of repeated analysis of D.S. growth mechanism, the present inventors have found that there are substances to act as nuclei at the center of D.S., and moisture permeate through the nuclei into the device to promote the D.S. growth. Sizes of the nuclei are in a range of very small submicrons to very large several tens of microns, and to prevent moisture permeation through all the nuclei, a protective film must satisfy the following two requirements: (1) a protective film itself has a low moisture permeability and (2) a thick protective film can be formed. However, all of the aforementioned prior art procedures failed to proposed a protective film satisfying these two requirements (1) and (2).

Furthermore, the present inventors have found that non-emitting regions gradually grow at the edges of the light-emitting surface as similar phenomena to those of D.S. growth. This is because organic materials are exposed at the edges of an organic electroluminescence device and moisture permeates through these exposed edges. Its influence is very large particularly in case that the light-emitting surface is formed in a dot form of high precision. However, a procedure of suppressing such growth of non-emission regions at the edges of the light-emitting surface has not been proposed prior to this invention.

That is, a sealing procedure of completely suppressing D.S. growth in an organic electro-luminescence device, which can satisfy the increasing demands for a thinner type device, a film type device, etc., and also a procedure of suppressing growth of non-emitting regions at the edge of the light-emitting surface have not been established prior to this invention.

SUMMARY OF THE INVENTION

An object of the present invention is to solve the foregoing problems and provide an electronic device including an organic electroluminescence device, protected by a dense protective film capable of film formation at a low temperature and preventing permeation of moisture, oxygen etc. into the device from the outside and a process for producing the same.

The present process for producing an electronic device comprises forming a dense protective film at a low temperature by ECR (electron cyclotron resonance) plasma sputtering to prevent permeation of moisture, oxygen, etc. into the device from the outside.

The electronic device according to the present invention is protected by a silicon oxynitride film at least one part of the outer surface of the electronic device, thereby preventing both device damage by the internal stress in the protective film and permeation of moisture, oxygen, etc. into the device from the outside.

DETAILED DESCRIPTION OF THE INVENTION

ECR plasma sputtering for use in the present process for producing an electronic device can form a film at a low temperature and thus can form a protective film on any devices including organic electro-luminescence devices, and devices susceptible to degradation of device characteristics by heat.

Silicon oxynitride (SiON) for use as a protective film in the present electronic device has a lower internal stress than those of $SiO_2$ and SiN and thus can suppress its influence on the device, and also has a lower moisture permeability than that of $SiO_2$ and thus is suitable for sealing the high moisture resistance-requiring devices.

Description will be made below of the organic electroluminescence device as an electronic device.

Substrate for use in the present organic electroluminescence device includes, for example, substrates of transparent or opaque glass, PET (polyethylene terephthalate), polycarbonate, amorphous polyolefin, etc. Flexible films or substrates formed from these materials can be used. In the present invention, the term "transparent" or "opaque" means such a transparency as not to inhibit visual observation of light emitted from the organic electroluminescence device.

Anode for use in the present organic electroluminescence device includes, for example, anodes of ITO, ATO (Sb-doped $SnO_2$), AZO (Al-doped ZnO), etc. organic thin film layer in the present organic electroluminescence device can be in any structure, i.e. a single layer structure of only a light-emitting layer, a double layer structure of a hole transport layer and a light-emitting layer, or a light-emitting layer and an electron transport layer, or a triple layer structure of a hole transport layer, a light-emitting layer and an electron transport layer. In case of the double layer or triple layer structure, layers are stacked so that the hole transport layer can be brought into contact with the anode and/or the electron transport layer can be brought into contact with the cathode.

Materials for the light-emitting layer in the organic electroluminescence device include, for example, a phosphor having fluorescent characteristics in the visible range and a good film formability, which includes, fluorescent brightening agents, for example, $Alq_3$, Be-benzoquinolinol ($BeBq_2$), benzoxazoles such as 2,5-bis(5,7-di-t-pentyl-2-benzoxazolyl)-1,3,4-thiadiazole, 4,4'-bis(5,7-pentyl-2-benzoxazolyl)-stilbene, 4,4'-bis[5,7-di(2-methyl-2-butyl)-2-benzoxazolyl]stilbene, 2,5-bis(5,7-di-t-pentyl-2-benzoxazoly)thiophene, 2,5-bis([5-α,α-dimethylbenzyl]-2-benzoxazolyl)thiophene, 2,5-bis[5,7-di-(2-methyl-2-butyl)-2-benzoxazolyl]-3,4-diphenylthiophene, 2,5-bis(5-methyl-2-benzoxazolyl)thiophene, 4,4'-bis(2-benzoxazolyl) biphenyl, 5-methyl-2-[2-(4-(5-methyl-2-benzoxazolyl) phenyl]vinyl]benzoxazolyl, 2-[5-(4-chlorophenyl)vinyl] naphtho[1,2-d]oxazole, etc., benzothiazoles such as 2,2'-(p-phenylenedivinylene)-bisbenzothiazole, etc., benzimidazoles such as 2-[2-[4-benzimidazolyl)phenyl] vinyl]benzimidazole, 2-[2-(4-carboxyphenyl)vinyl] benzimidazole, etc., 8-hydroxyquinoline-based metal complexes such as tris(8-quinolinol)aluminum, bis(8-quinolinol) magnesium, bis(benzo[f]-8-quinolinol)zinc, bis(2-methyl-8-quinolinolato)aluminum oxide, tris(8-quinolinol)indium, tris(5-methyl-8-quinolinol)aluminum, 8-quinolinol lithium, tris(5-chloro-8-quinolinol) gallium, bis(5-chloro-8-quinolinol)calcium, poly[zinc-bis(8-hydroxy-5-quinolinyl) methane, etc., metal chelated oxynoid compounds such as dilithium epindolizione, etc., styrylbenzene-based compounds such as 1,4-bis(2-methylstyryl)benzene, 1,4-(3-methylstyryl)benzene, 1,4-bis(4-methylstyryl)benzene, distyrylbenzene, 1,4-bis(2-ethylstyryl)benzene, 1,4-bis(3-ethylstyryl)]benzene, 1,4-bis(2-methylstyryl)-2-methylbenzene, 1,4-bis(2-methylstyryl)-2-methylbenzene, etc., distyrylpirazine derivatives such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)-pirazine, 2,5-bis[2-(4-biphenyl)vinyl]pirazine, 2,5-bis[2-(1-pyrenyl)vinyl)pirazine], etc. naphthalimide derivatives, perylene derivatives, oxadiazole derivatives, aldazine derivatives, cyclopentadiene derivatives, styrylamine derivatives, cumarine derivatives, aromatic dimethylidene derivatives, etc. Anthracence, salicylates, pyrene, coronene, etc. can also be used.

Materials for the hole transport layer in the organic electroluminescence device preferably include, for example, an organic material having a high hole mobility and good transparency and film formability, which includes TPD, porphyrin compounds such as porphine, tetraphenylporphine copper, phthalocyanine, copper phthalocyanine, titanium phthalocyanine oxide, etc., aromatic tertiary amines such as 1,1-bis[4-(di-p-tolylamino)phenyl]cyclohexane, 4,4',4"-trimethyltriphenylamine, N,N,N',N'-tetrakis(p-tolyl)-p-phenylenediamine, 1-(N,N-di-p-tolylamino) naphthalene, 4,4'-bis(dimethylamino)-2,2'-dimethyltriphenylmethane, N,N,N'-N'-tetraphenyl-4,4'-diaminobiphenyl, N,N'-diphenyl-N,N'-di-m-tolyl-4, N,N-diphenyl-N,N'-bis(3-methylphenyl)-1,1'-4,4'-diamine, 4'-diaminobiphenyl, N-phenylcarbazol, etc., stilbene compounds such as 4-di-p-tolylaminostilbene, 4-(di-p-tolylamino)-4'-[4-(di-p-tolylamino)styryl]stilbene, etc., triazole derivatives, oxadiazole derivatives, imidazole derivatives, polyarylalkane derivatives, pyrazoline derivatives, pyrazolone derivatives, phenylenediamine derivatives, anilamine derivatives, amino-substituted chalcone derivatives, oxazole derivatives, styrylanthracene derivatives, fluorenone derivatives, hydrazone derivatives, silazane derivatives, polysilane-aniline-based copolymers, polymeric oligomers, styrylamine compounds, aromatic dimethylidyne compounds, poly-3-methylthiophene, etc. Hole transport layer of polymer dispersion series, which comprises a polymer such as polycarbonate, etc. and a low molecular weight organic material for hole transport layer dispersed in the polymer can be also used.

For the electron transport layer in the organic electroluminescence device, dioxadiazole derivatives such as 1,3-bis (4-tert-butylphenyl-1,3,4-oxadiazolyl)phenylene (OXD-7), etc., anthraquino-dimethane derivatives, diphenylquinone derivatives, etc. can be used.

For the cathode in the organic electro-luminescence device, metals or alloys having a low work function can be used. For example, metals such as Al, In, Mg, Ti, etc., Mg alloys such as Mg—Ag alloy, Mg—In alloy, etc., Al alloys such as Al—Li alloy, Al—Sr alloy, Al—Ba alloy, etc. and the like can be used.

The present invention will be described below, referring to embodiments and Examples.

Embodiment 1

A process for forming a protective film according to one embodiment of the present invention will be described below.

Film forming procedure using plasma can easily form excitons and can lower the process temperature and thus is utilized in formation of various films. Above all, ECR plasma sputtering is a procedure of forming a film by generating a plasma under a low gas pressure ($<<10^{-4}$ Torr) by electron cyclotron resonance (ECR) and ionizing a solid target by the generated plasma.

Figure 1:
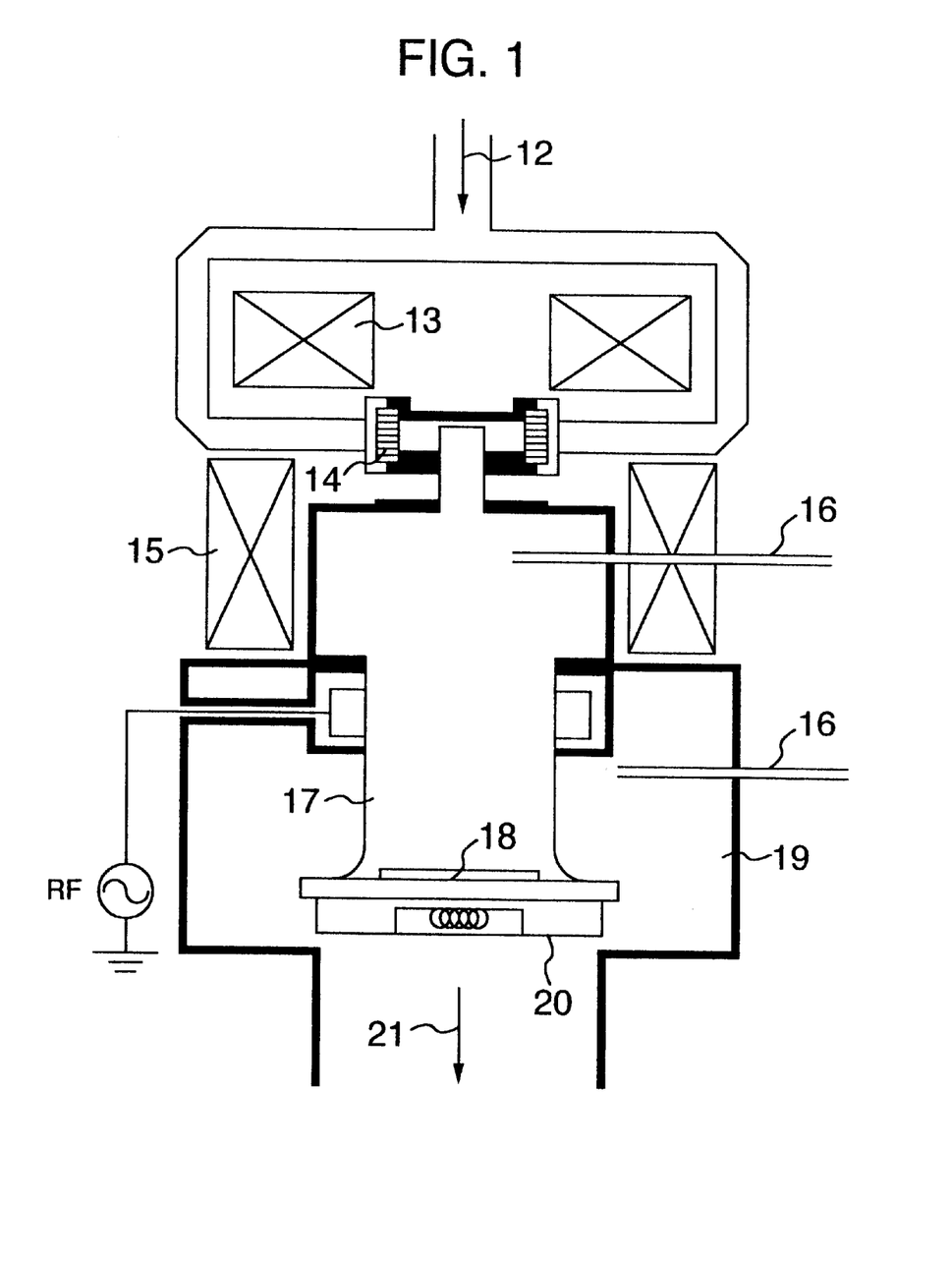
FIG. 1 is a schematic view of a microwave branching-rejoining type ECR sputtering apparatus for use in one embodiment of the present invention.

FIG. 1 is a schematic view of a microwave branching-rejoining type ECR sputtering apparatus for use in the ECR plasma sputtering. In FIG. 1, 12 is an entrance of microwave (2.45 GHz), 13 is coil 1, 14 is a quartz window, 15 is coil 2, 16 is a gas feed pipe, 17 is a plasma chamber, 18 is a substrate, 19 is a film-forming chamber, 20 is a heater, and 21 is an exit to vent system. Microwave (2.45 GHz) 12 generated by a magnetron is branched and then the branched plasmas are led to a plasma chamber 17 through quartz windows 14 around coil 1, respectively. A magnetic field (875 G) is applied to the plasma chamber 17 by an external coil 2 to establish ECR conditions to the microwave frequency of 2.45 GHz and plasma is generated by introducing Ar, $O_2$, $N_2$, etc. into the plasma chamber 17. A target of Si, etc. is provided at the plasma outlet and sputtered by applying RF voltage thereto.

Description will be made below of formation of a protective film on an organic electroluminescence device, referring to FIG. 2.

Figure 2:
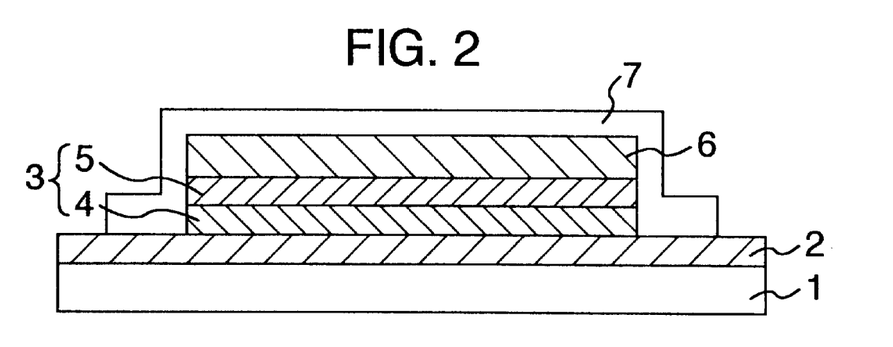
FIG. 2 is a cross-sectional view showing the essential part of an organic electroluminescence device according to one embodiment of the present invention.

FIG. 2 is a cross-sectional view showing the essential part of an organic electroluminescence device according to Embodiment 1 of the present invention.

In FIG. 2, reference numeral 7 shows a protective film formed by ECR plasma sputtering.

Substrate 1, anode 2, organic thin film layer 3, hole transport layer 4, light-emitting layer 5 and cathode 6 are the same as in FIG. 7 showing the conventional organic electroluminescence device as already described in Related Art of the Invention and, in FIG. 2 the same members are identified with the same reference numerals as in FIG. 7 and their explanation will be omitted below.

As shown in FIG. 2, the organic electro-luminescence device according to Embodiment 1 of the present invention is protected by a protective film formed on at least one part of the outer surface of the device by ECR plasma sputtering.

The organic electroluminescence device according to Embodiment 1 differs from the conventional device in formation of a protective film by ECR plasma sputtering. ECR plasma sputtering can form a dense film capable of preventing permeation of moisture, oxygen, etc. from the outside without damaging the organic electroluminescence device including cathode 6, etc.

Functions of the organic electroluminescence device in the foregoing structure according to Embodiment 1 are the same as those of the conventional device and thus their explanation will be omitted below.

According to Embodiment 1 of the present invention, an organic electroluminescence device comprising a substrate, a pair of electrodes disposed on the substrate and at least one organic layer as stacked between the electrodes can be made into a highly reliable device with suppressed D.C. growth by protecting at least one part of the outer surface of the device with a protective film formed by ECR plasma sputtering, thereby preventing permeation of moisture, oxygen, etc. into the device from the outside.

In Embodiment 1, description has been made of an organic thin film layer in a double layer structure of a hole transport layer and a light-emitting layer, but in the present invention the structure is not particularly limited to the double layer structure, as already explained before.

As to the sealing form, description has been made of sealing only with a protective film in Embodiment 1, but the present invention is not particularly limited to this form. That is, combinations of a protective film with a shielding material, etc. can also be employed.

Embodiment 2

Description will be made below of an organic electroluminescence device according to another embodiment of the present invention.

Figure 3:
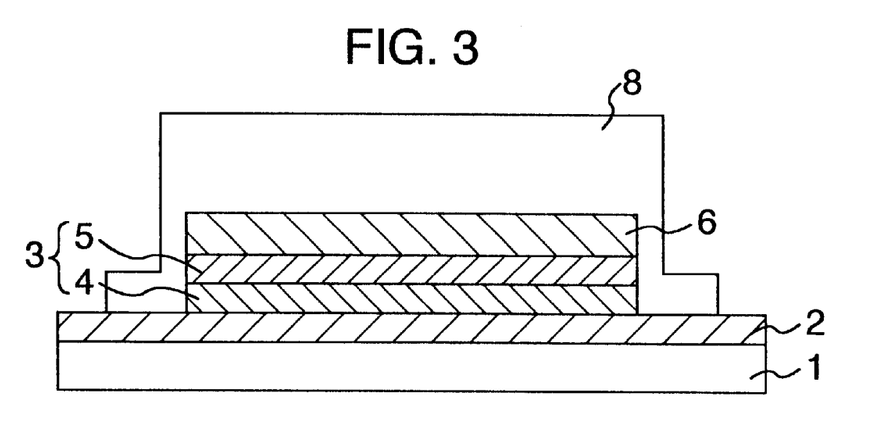
FIG. 3 is a cross-sectional view showing the essential part of an organic electroluminescence device according to another embodiment of the present invention.

FIG. 3 is a cross-sectional view of the essential part of an organic electroluminescence device according to another embodiment of the present invention.

In FIG. 3, reference numeral 8 means a protective film formed from SiON by ECR plasma sputtering. Substrate 1, anode 2, organic thin film layer 3, hole transport layer 4, light-emitting layer 5 and cathode 6 are the same as given in FIG. 7 of the prior art, and same members are identified with the same reference numerals as in FIG. 7. Their explanation will be omitted below.

As shown in FIG. 3, at least one part of the outer surface of an organic electroluminescence device according to Embodiment 2 is protected by an SiON film formed by ECR plasma sputtering.

The organic electroluminescence device according to Embodiment 2 differs from the conventional device in that an silicon oxynitride (SiON) protective film is formed by ECR plasma sputtering and that the SiON protective film is a thick film. A dense and thick SiON protective film can be formed in Embodiment 2 by ECR plasma sputtering without damaging the organic electroluminescence device including cathode 6, etc. by temperature elevation during the film formation, and a highly reliable organic electroluminescence device with suppressed D.S. growth can be produced.

In Embodiment 2, description has been made of an organic thin film layer in a double layer structure of a hole transport layer and a light-emitting layer, but the structure is not particularly limited to the double layer structure, as already explained before.

As to the sealing form, description has been made of sealing only with a protective film in Embodiment 2, but the present invention is not particularly limited to this form. That is, combinations of a protective film with a shielding material, etc. can also be employed.

As described above, the present invention provides a process for producing an electronic device protected by at least one layer of the protective film, formed by ECR plasma sputtering. A dense protective film can be formed at a low temperature thereby, and a highly reliable device capable of protecting permeation of moisture, oxygen, etc. into the device from the outside can be produced.

Furthermore, the present process for producing an electronic device with at least one layer of a protective layer formed by ECR plasma sputtering is an organic electroluminescence device in a stacked layer structure, which comprises a substrate, a pair of electrodes disposed on the substrate, at least one organic thin film layer sandwiched between the electrodes, and a protective film formed by ECR plasma sputtering on at least one part of the outer surface of the device, where a dense protective film can be formed without thermally damaging the device, thereby preventing permeation of moisture, oxygen etc. into the device from the outside and thus a highly reliable organic electroluminescence device with suppressed D.S. growth can be obtained.

Furthermore, the present invention provides an electrically functional electronic device protected with a silicon oxynitride (SiON) protective film formed on at least one part of the outer surface of the device, whereby the internal stress in the protective film can be reduced and the protective film can be made thicker, thereby obtaining a highly reliable device.

Furthermore, the present electronic device protected with a SiON protective film formed on at least one part of the outer surface of the device is an organic electroluminescence device in a stacked layer structure, which comprises a substrate, a pair of electrodes disposed on the substrate and at least one organic thin film layer sandwiched between the electrode, where the protective film can be made thicker without damaging the device due to the internal stress in the protective film, thereby obtaining a highly reliable organic electroluminescence device with suppressed D.S. growth.

Furthermore, the present invention provides an electrically functional electronic device, protected with a SiON protective film formed on at least one part of the outer surface of the device by ECR plasma sputtering, where a dense protective film can be formed without damaging the device by temperature elevation during the protective film formation and the protective film can be made thicker, thereby obtaining a highly reliable electronic device.

Still furthermore, the present electronic device protected with an SiON protective film formed on at least one part of the outer surface of the device by ECR plasma sputtering is an organic electroluminescence device in a stacked layer structure, which comprises a substrate, a pair of electrodes disposed on the substrate and at least one organic thin film layer sandwiched between the electrodes, where a dense protective film can be formed without damaging the device by temperature elevation during the protective film formation and the protective film can be made thicker, thereby obtaining a highly reliable organic electroluminescence device with suppressed D.S. growth.

Embodiment 3

Description will be made below of an organic electroluminescence device according to another embodiment of the present invention.

Figure 4:
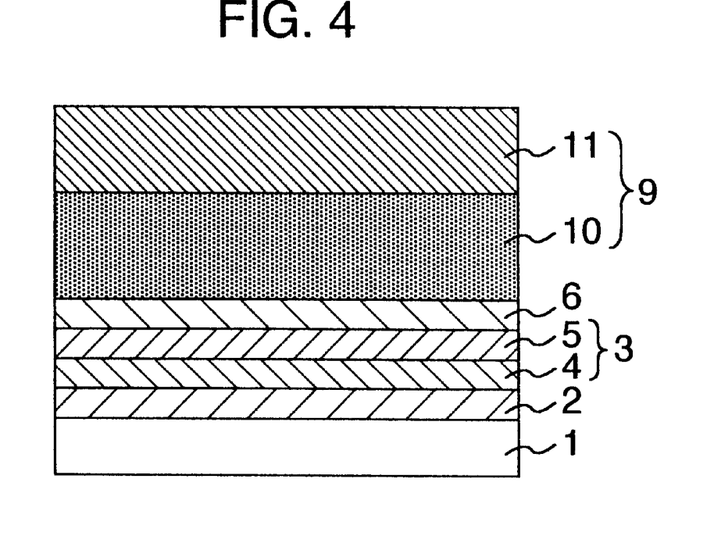
FIG. 4 is a cross-sectional view showing the essential part of an organic electroluminescence device according to still another embodiment of the present invention

FIG. 4 is a cross-sectional view showing the essential part of an organic electroluminescence device according to another embodiment of the present invention.

In FIG. 4, substrate 1, anode 2, organic thin film layer 3, hole transport layer 4, light-emitting layer 5 and cathode 6 are the same as given in FIG. 7 of the prior art, and the same members are identified with the same reference number as in FIG. 7. Their explanation will be omitted below. Numeral 9 means a protective film in a stacked layer structure of an organic material layer 10 and an SiON layer 11.

Figure 5:
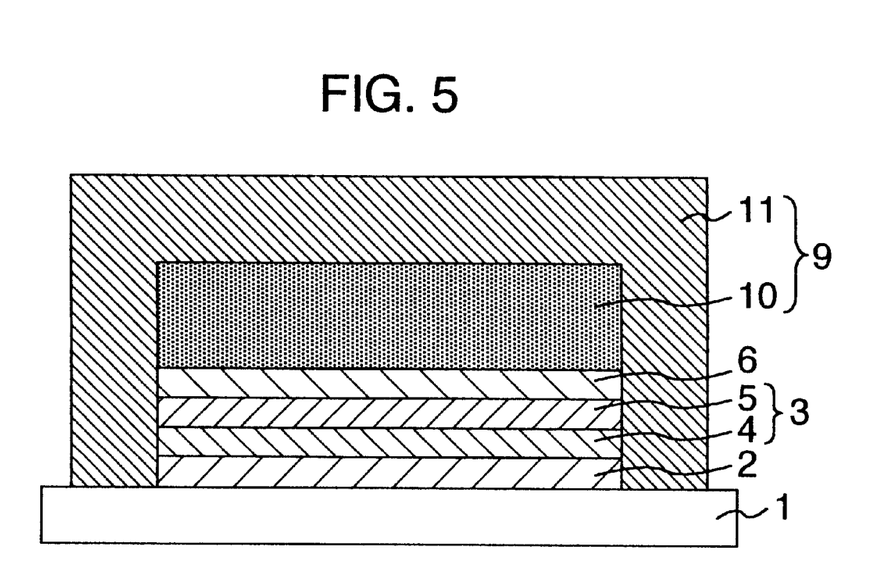
FIG. 5 is a cross-sectional view showing the essential part of an organic electroluminescence device according to still another embodiment of the present invention.

As shown in FIG. 5, the present organic electroluminescence device of Embodiment 3 is substantially identical in structural materials and formation procedures with the prior art device except for the protective film.

The present organic electroluminescence device of Embodiment 3 differs from the prior art device in that the protective film formed on the cathode outer surface has a stacked layer structure of an organic material layer and an SiON layer, whereby the protective film can be made thicker without damaging the device due to internal stress in the protective film, etc., thereby obtaining a highly reliable organic electroluminescence device with suppressed D.S. growth.

In Embodiment 3, description has been made of an organic thin film layer in a double layer structure of a hole transport layer and a light-emitting layer, but the structure of the organic thin film layer is not particularly limited to the double layer structure, as already mentioned above.

As to the structure of the protective film, description has been made of the stacked layer structure of double layer, i.e. an organic material layer and an SiON layer, but the structure of the protective film is not particularly limited to the stacked layer structure of double layer. That is, so far as formation of a thick film and a low moisture permeability are compatible with each other, such a stacked layer structure of triple layer as organic material layer/SiON layer/organic material layer, or SiON layer/organic material layer/SiON layer, etc. can be used, irrespective of layer structure, layer stacking sequence, etc.

For organic materials for use in the organic material layer in the protective film, the aforementioned structural materials for the organic electroluminescence device, polymeric materials such as polyparaxylene, polychloroparaxylene, polyimide, etc., and the like can be used, so long as they can form a thick film with lower internal stress in the film.

Embodiment 4

Description will be described below of an organic electroluminescence device according to still another embodiment of the present invention.

FIG. 5 is a cross-sectional view showing the essential part of an organic electroluminescence device according to still another embodiment of the present invention.

In FIG. 5, substrate 1, anode 2, organic thin film layer 3, hole transport layer 4, light-emitting layer 5 and cathode 6 are the same as shown in FIG. 7 of the prior art, and the same members are identified with the same reference numerals as in FIG. 7. Their explanation will be omitted below. In Embodiment 4, numeral 9 means a protective film in a stacked layer structure of an organic material layer 10 and an SiON layer 11, as in Embodiment 3.

As shown in FIG. 5, the present organic electroluminescence device of Embodiment 4 is identical in the structural material, formation procedures, etc. with the prior art device except for the protective film.

The organic electroluminescence device of Embodiment 4 differs from the prior art in that the protective film formed on the cathode upper surface has a stacked layer structure of two layers, i.e. an organic material layer and an SiON layer, and that the SiON layer has a larger area than that of the organic material layer, thereby covering the device up to the device edges, whereby moisture permeation not only from the device upper surface but also from the device edges can be suppressed, thereby obtaining a highly reliable organic electroluminescence device not only with suppressed D.S. growth but also with suppressed growth of non-emitting regions at the light-emitting surface edges.

In Embodiment 4, description has been made of an organic thin film layer in a double layer structure of a hole transport layer and a light-emitting layer, but the structure of the organic thin film layer is not particularly limited to the double layer structure, as already mentioned above.

As to the structure of the protective film, description has been made of the stacked layer structure of double layer, i.e. an organic material layer and an SiON layer, but the structure of the protective film is not particularly limited to the stacked layer structure of double layer. That is, so far as formation of a thick film and a low moisture permeability are compatible with each other, such a stacked layer structure of triple layer as organic material layer/SiON layer/organic material layer or SiON layer/organic material layer/SiON layer can be used, irrespective of layer structure, layer stacking sequence, etc.

As described above, the present invention provides an organic electroluminescence device in a stacked layer structure, which comprises a substrate, an anode for injecting holes, a light-emitting layer having a light-emitting region, and a cathode for injecting electrons, successively provided on the substrate, and further a protective film provided thereon, where the protective film is in a stacked layer structure of two or more layers of different materials, and at least one layer of the protective film is an SiON layer. Permeation of moisture, oxygen, etc. into the device from the outside can be completely prevented by the thickened protective film without damaging the device, and thus a highly reliable organic electroluminescence device with suppressed D.S. growth can be obtained.

SiON is smaller in internal stress than $SiO_2$ or SiN and influence of the internal stress on the device can be suppressed. SiON also is lower in moisture permeability than $SiO_2$ and thus is most suitable for sealing an organic electroluminescence device requiring a high moisture resistance.

However, SiON alone is very difficult to form a thick protective film necessary for the organic electroluminescence device, though SiON is low in internal stress, and thus it is necessary to form a thick protective film from a combination of SiON with other materials.

In the present invention, the protective film is in a stacked layer structure of a SiON layer and a layer of a material having a lower internal stress than that of SiON, where lower moisture permeation can be attained in the protective film by the SiON layer and thick protective film formation can be attained by the layer of a material having a lower internal stress, and thus a highly reliable electroluminescence device with suppressed D.S. growth can be obtained.

In the present invention, the protective film is in a stacked layer structure of an organic material layer and an SiON layer, where a thick protective layer can be relatively simply formed by a combination of the SiON layer with the organic material layer capable of easy thick film formation, thereby obtaining a highly reliable organic electroluminescence device with suppressed D.S. growth.

In the present invention, the protective film has a larger area than that of the light-emitting surface of the device, and the SiON layer having a low moisture permeability occupies the largest covering area among the layers in the protective film so as to completely cover the light-emitting surface of the device and the organic material layer in the protective film, thereby suppressing permeation of moisture at the edges of the light-emitting surface of the device. Thus, a highly reliable organic electroluminescence device with suppressed growth of non-emission regions can be obtained.

In the present invention, the protective film has a larger area than that of the light-emitting surface of the device, and the SiON layer having a low moisture permeability occupis the largest covering area among the layers in the protective film so as to completely cover the light-emitting surface of the device and the organic material layer in the protective film, thereby suppressing permeation of moisture at the edges of the light-emitting surface of the device. Thus, a highly reliable organic electroluminescence device with suppressed growth of non-emission regions can be obtained.

In the present invention, the SiON layer having a low moisture permeability can be formed by ECR plasma sputtering or ECR plasma CVD, that is, can be formed at a low temperature. In other words, the protective film can be formed stably without damaging the device by temperature elevation.

EXAMPLE 1

An ITO film was formed on a glass substrate to a film thickness of 160 nm by sputtering and then a resist (OFPR-800, made by Tokyo Ohka K. K.) was applied onto the ITO film by spin coating to form a resist film having a film thickness of 10 µm. The resist film was patterned into a desired pattern by masking, light exposure and development. Then, the glass substrate was dipped into 50% hydrochloric acid at 60° C. to etch the ITO film in the resist film-free regions and then the remaining resist film was removed, whereby the glass substrate with an anode of ITO film in the desired pattern was obtained.

Then, the glass substrate was subjected to ultrasonic cleaning with a cleaner (Semicoclean, made by Furuuchi Kagaku K. K.) for 5 minutes, then to ultrasonic cleaning with pure water for 10 minutes, then to ultrasonic cleaning with a mixture of one part by volume of ammonia water with one part by volume of an aqueous hydrogen peroxide solution and 5 parts by volume of water for 5 minutes and then to ultrasonic cleaning with pure water at 70° C. for 5 minutes. Then, moisture remaining on the glass substrate was removed by nitrogen blowing and then dried by heating at 250° C.

Then, a TPD film was formed as a hole transport layer on the surface of the glass substrate on the cathode-carrying side to a film thickness of about 50 nm in a resistance-heated vapor deposition chamber under reduced pressure, i.e. at a vacuum degree of $2 \times 10^{-6}$ Torr or less.

Then, an $Alq_3$ film was formed as a light-emitting layer on the hole transport layer to a film thickness of about 50 nm likewise in the resistance-heated vapor deposition chamber. Vapor deposition rates of TPD and $Alq_3$ were the same, i.e. 0.2 nm/s.

Then, a cathode was formed from an Al—Li alloy containing 15 wt. % Li as a vapor deposition source on the light-emitting layer to a film thickness of 150 nm likewise in the resistance-heated vapor deposition chamber.

An $SiO_2$ protective film or an SiN protective film was formed on the upper surface of the resulting organic electroluminescence device by ECR plasma sputtering, thereby obtaining a organic electroluminescence device protected with a $SiO_2$ or SiN protective film.

The sputtering was carried out under the following conditions:

Microwave power: 300 W

RF power: 100 W

Gas flow rate (Ar): 16 sccm

Flow rate ratio of $O_2/(N_2+O_2)$: O (SiN)

Flow rate ratio of $O_2/(N_2+O_2)$: 1 ($SiO_2$)

The resulting protective film thickness was set to 0.5 µm for both SiN and $SiO_2$.

Likewise, a germanium monoxide (GeO) protective film was formed by vacuum vapor deposition to a film thickness of 0.5 μm or an $SiO_2$ protective film by electron beam vapor deposition to a film thickness of 0.5 μm on the organic electroluminescence device formed up to the cathode, thereby obtaining an organic electro-luminescence device protected with a GeO or $SiO_2$ protective film.

For the foregoing 4 kinds of organic electro-luminescence devices, sizes (μm) of grown dark spot (D.S.) on the light-emitting surface of the devices were measured after storing for 500 hours at 60° C. and 90% RH (where the D.S. size on the just sealed devices was presumed to be zero).

The results are shown in Table 1, which reveals that the D.S. growth suppression effects increases in the following order:

SiN (ECR)>$SiO_2$ (ECR)>>SiO (electron beam vapor deposition>GeO (vapor deposition)

TABLE 1

| Protective film composition | Film formation procedure | Film thickness (μm) | Size of grown D.S. (μm) after storing for 500 hours at 60° C. and 90% RH |
|---|---|---|---|
| SiN | ECR | 0.5 | 40 |
| $SiO_2$ | ECR | 0.5 | 50 |
| GeO | Vapor Deposition | 0.5 | 165 |
| $SiO_2$ | Electron Beam Vapor Deposition | 0.5 | 120 |

Even if the same material ($SiO_2$) was used for the protective film, there was a difference in effect, depending on the film formation procedures. That is, the protective films formed by ECR plasma sputtering were denser than the protective films formed by the vapor deposition procedures and thus could suppress permeation of moisture and oxygen into the devices from the outside.

EXAMPLE 2

An organic electroluminescence device was formed up to the formation of cathode in the same manner as in Example 1, and then a protective film was formed on the upper surface of the device by ECR plasma sputtering, where the protective film composition was changed from $SiO_2$ through SiON to SiN by changing the flow rate ratio of $O_2/(N_2+O_2)$, and the film-formable thickness and sizes of grown D.S. after storing for 500 hours at 60° C. and 90% RH were evaluated. The film-formable thickness is a thickness which gives no damage to the device, and formation of a protective film above the film-formable thickness will give rise to generation of cracks, etc. The other film forming conditions were the same as in Example 1.

Figure 6:
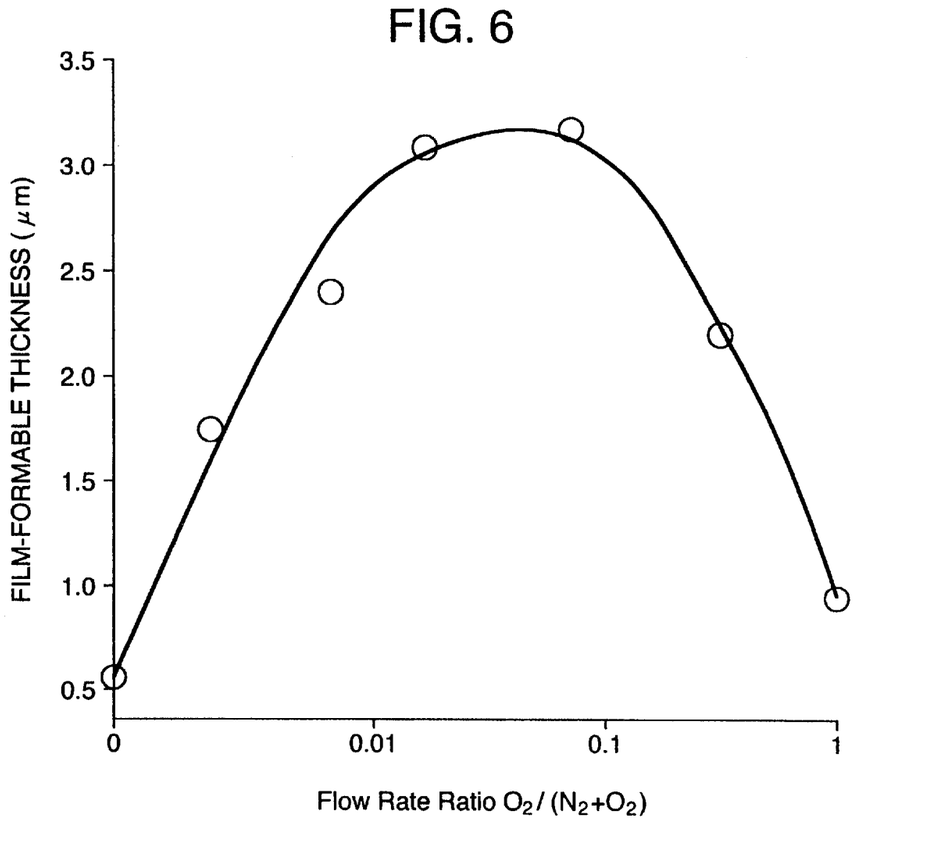
FIG. 6 is a diagram showing film-formable thicknesses of $SiO_2$, SiON and SiN by ECR plasma sputtering.

Film-formable thickness is given in FIG. 6. As shown in FIG. 6, the formable film thickness is the largest, i.e. 3 μm when the flow rate ratio of $O_2/(N_2+O_2)$ is between 0.036 and 0.08, whereas the film-formable thickness becomes smaller with increasing partial pressures of $N_2$ and $O_2$ outside said ranges, because the SiON layer seems to be smaller in the internal stress than the $SiO_2$ layer and the SiN layer.

The film-formable thickness (μm) and film composition in the flow rate ratios of $O_2/(N_2+O_2)$ as shown in FIG. 6 and the sizes of grown D.S. after storing for 500 hours at 60° C. and 90% RH are shown in Table 2.

TABLE 2

| Protective film composition | Formable film thickness (μm) | Size (μm) of grown D.S. after storing for 500 hours at 60° C. and 90% RH |
|---|---|---|
| SiN | 0.6 | 35 |
| SiON | 2.0 | 25 |
| SiON | 3.0 | 20 |
| $SiO_2$ | 0.9 | 95 |

Among the protective film compositions, SiN is best in the moisture permeation resistance, followed by SiON and $SiO_2$ in this order, but it can be seen in view of the formable film thickness that SiON is most effective for the protective film on an organic electroluminescence device.

As described above, the present invention can provide a highly reliable electronic device including an organic electroluminescence device by forming a dense protective film on the device by ECR plasma sputtering, thereby preventing degradation of the device due to temperature elevation during the protective film formation.

Furthermore, the present invention can provide a highly reliable electronic device including an organic electroluminescence device by protecting the device with a thick protective film of SiON without damaging the device by the internal stress in the protective film, thereby preventing permeation of moisture, oxygen, etc. into the device from the outside.

EXAMPLE 3

An organic electroluminescence device was formed up to the formation of cathode in the same manner as in Example 1, and a photopolymerizable epoxy resin (30Y-296G, made by Three-Bond K. K.) was applied to the upper surface of the device to any desired layer thickness by spin coating or screen printing, followed by curing of the epoxy resin by a high pressure mercury lamp. A SiON layer was formed thereon to a layer thickness of 0.5 μm by ECR plasma sputtering, thereby forming an organic electroluminescence device protected by a protective film in a double layer structure of the cured epoxy resin layer and the SiON layer.

The sputtering conditions for the SiON layer were as follows:

Microwave power: 300 W

RF power: 100 w

Gas flow rate (Ar): 16 sccm

Flow rate ratio of $O_2/(N_2+O_2)$: 0.05

For the thus obtained devices, the relationships between the thickness each of layers in the protective film, and the light-emitting stability and the number of grown D.S. were investigated and the results are given in the following Table 3.

TABLE 3

| Epoxy resin layer thickness (μm) | 0 | 0 | 0.5 | 1.5 | 2.5 | 4.5 | 9.5 | 29.5 |
|---|---|---|---|---|---|---|---|---|
| SiON layer thickness (μm) | 0 | 0.5 | 0.5 | 0.5 | 0.5 | 0.5 | 0.5 | 0.5 |

TABLE 3-continued

| Light-emitting stability | ○ | ○ | ○ | ○ | ○ | ○ | ○ | ○ |
|---|---|---|---|---|---|---|---|---|
| Number of grown D.S. | x | x | x | Δ | Δ→○ | ○ | ⊚ | ⊚ |

Remarks:
1) Light-emitting stability mark "○" means "good".
2) "Number of grown dark spots" marks "x", "Δ", "○" and "⊚" means "considerably large", "large", "small" and "negligible", respectively.

As is clear from Table 3, the thicker the protective film of the epoxy resin layer and the SiON layer on the device, the less the number of grown D.S. Its effect is remarkable in the protective film thickness of 5 μm or more.

As to the light emitting stability, there is no adverse effect on the device such as short circuit, peeling, etc. even if the resin layer thickness is increased, and stable light emission can be obtained.

When the protective film thickness is 10 μm or more, the D.S. growth can be almost completely suppressed.

EXAMPLE 4

An organic electroluminescence device was formed up to the formation of cathode in the same manner as in Example 1, and was protected with a protective film in a double layer structure of (1) an epoxy resin layer (9.5 μm thick)+an SiON layer (0.5 μm thick), where the epoxy resin layer has a larger area than that of the SiON layer or (2) an epoxy resin layer (9.5 μm thick)+an SiON layer (0.5 μm thick), where the SiON layer has a larger area than that of the epoxy resin layer so as to completely cover the edges of the device by the SiON layer, thereby producing two kinds of the device.

The devices were stored at 60° C. and 90% RH, and the relationships between the protective film structure and the profile, and the growth of D.S. and the non-emitting regions at the edges of the light-emitting surface were investigated, and the results are given in the following Table 4.

TABLE 4

| Protective film structure | D.S. growth | | | Growth of non-emitting regions at edges of light-emitting surface | | |
|---|---|---|---|---|---|---|
| | 100 hrs | 500 hrs | 1000 hrs | 100 hrs | 500 hrs | 1000 hrs |
| (1) epoxy resin layer (9.5 μm thick) + SiON layer (0.5 μm thick) Area: epoxy resin layer > SiON layer | ⊚ | ⊚ | ⊚ | ○ | Δ | x |
| (2) epoxy resin layer (9.5 μm thick) + SiON layer (0.5 μm thick) Area: epoxy resin layer < SiON layer | ⊚ | ⊚ | ⊚ | ⊚ | ⊚ | ⊚ |

Remark:
Marks "⊚", "○", "Δ" and "x" means "negligible", "less", "slight" and "considerable", respectively.

As can been seen from Table 4, in the two devices, permeation of moisture into the devices from the upper surfaces can be substantially suppressed, irrespective of the area of the SiON layer; and no D.S. growth is observable even after 1,000 hours.

On the other hand, the growth of non-emitting regions due to permeation of moisture at the edges of the light-emitting surface is observable in case the device is protected with a protective film in a double layer of an epoxy resin layer and an SiON layer, but is not covered at the edges of the device by the SiON layer because of the smaller area of the SiON layer than that of the epoxy resin layer, allowing gradual permeation of moisture into the device from the outside.

In contrast, no growth of non-emitting regions is observable even after stored for a long time in case the device is protected by a protective film in a double layer structure of an epoxy resin layer and an SiON layer, so that the SiON layer having a larger area than that of the epoxy resin layer can completely cover even the edges of the device.

As described above, the present invention can provide a highly reliable organic electroluminescence device by forming a dense protective film on the upper surface of an electroluminescence device to such a film thickness as to completely suppress D.S. growth and also prevent permeation of moisture, oxygen, etc. into the device from the outside. The present invention can also provide an electronic device including an organic electroluminescence device protected with a dense protective film capable of being formed at a low temperature and preventing permeation of moisture, oxygen, etc. into the device from the outside, and a process for producing the same.

What is claimed is:

1. An organic electro-luminescence device comprising:
   a substrate,
   a light-emitting layer having a light-emitting region,
   an anode for injecting holes into the light-emitting layer,
   a cathode for injecting electrons into the light-emitting layer, and
   a protective film attached to the substrate,
   wherein the protective film comprises a silicon oxynitride layer and the protective film and the substrate enclose the light-emitting layer and the silicon oxynitride layer and the substrate enclose the anode, the light-emitting layer and the cathode.

2. An organic electro-luminescence device comprising:
   a substrate,
   a light-emitting layer having a light-emitting region,
   an anode for injecting holes into the light-emitting layer,
   a cathode for injecting electrons into the light-emitting layer, and
   a protective film attached to the substrate,
   wherein the protective film comprises a silicon oxynitride layer and the protective film and the substrate enclose the light-emitting layer, the protective film has a stacked layer structure comprising at least two different layers, and the silicon oxynitride layer and the substrate enclose the anode, the light-emitting layer, the cathode and layers other than the silicon oxynitride layer in the protective film.

* * * * *